(12) United States Patent
Traub et al.

(10) Patent No.: US 12,550,282 B2
(45) Date of Patent: Feb. 10, 2026

(54) MODULARLY ASSEMBLED AUTOMATION SYSTEM

(71) Applicant: Siemens Aktiengesellschaft, Munich (DE)

(72) Inventors: Andreas Traub, Amberg (DE); Michael Bräunlich, Chemnitz (DE); Christian Auerswald, Chemnitz (DE); Stefan Holtz, Leipzig (DE); Frantisek Zurek, Chemnitz (DE); Lydia Rowena Braeuning, Chemnitz (DE)

(73) Assignee: Siemens Aktiengesellschaft, Munich (DE)

( * ) Notice: Subject to any disclaimer, the term of this patent is extended or adjusted under 35 U.S.C. 154(b) by 391 days.

(21) Appl. No.: 18/225,075

(22) Filed: Jul. 21, 2023

(65) Prior Publication Data

US 2024/0040732 A1 Feb. 1, 2024

(30) Foreign Application Priority Data

Jul. 28, 2022 (EP) .................................... 22187562

(51) Int. Cl.
*H05K 7/14* (2006.01)

(52) U.S. Cl.
CPC ......... *H05K 7/1477* (2013.01); *H05K 7/1474* (2013.01); *H05K 7/1484* (2013.01)

(58) Field of Classification Search
None
See application file for complete search history.

(56) References Cited

U.S. PATENT DOCUMENTS

| 6,028,865 | A | * | 2/2000 | Rusche | H05K 7/1441 |
| | | | | | 439/712 |
| 11,490,538 | B2 | * | 11/2022 | Beckhoff | H05K 7/1477 |
| 11,956,915 | B2 | * | 4/2024 | Beckhoff | H05K 9/0015 |
| 2004/0201972 | A1 | * | 10/2004 | Walesa | H05K 7/1484 |
| | | | | | 361/788 |

(Continued)

FOREIGN PATENT DOCUMENTS

| DE | 102014111031 | 2/2016 |
| DE | 102018129835 | 5/2020 |

OTHER PUBLICATIONS

Beckhoff "Design-Guide to EJ Backplane for TwinSAFE Modules", Version 1.5.1, pp. 1-39, Jan. 29, 2018.

*Primary Examiner* — Krystal Robinson
(74) *Attorney, Agent, or Firm* — Cozen O'Connor

(57) ABSTRACT

A modularly assembled automation system includes a main unit with a plug-in bus port connector, a plurality of modules each with a plug-in bus connector and a plug-in signal connector, a backplane bus board in a layered structure with bus conductor tracks, a motherboard on which a plurality of connector elements are arranged, wherein the plug-in signal connectors of the modules are arranged in the connector elements and the connector elements are in electrical contact with conductor tracks of the motherboard, the bus conductor tracks and the layered structure of the backplane bus board are configured such that a layer stack forming the bus conductor tracks and core material contains features necessary for maintaining signal integrity of the signals on the backplane bus board and thus, with respect to the signal integrity of the signals on the backplane bus board, this is arranged separately on the motherboard.

8 Claims, 7 Drawing Sheets

(56) References Cited

U.S. PATENT DOCUMENTS

2012/0327619 A1* 12/2012 Herkenrath .......... H05K 7/1468
  361/759
2018/0349309 A1* 12/2018 Klaba ................. G06F 13/4027
2020/0280177 A1   9/2020 Budde et al.
2022/0256731 A1*  8/2022 Gurlt ................... H05K 7/2039

* cited by examiner

MODULARLY ASSEMBLED AUTOMATION SYSTEM

BACKGROUND OF THE INVENTION

1. Field of the Invention

The invention relates to a modularly assembled automation system comprising a main unit having a plug-in bus port connector, a plurality of modules each having a plug-in bus connector and a plug-in signal connector and a motherboard on which the main unit and the modules are arranged with a plurality of connection devices.

2. Description of the Related Art

In automation technology, actuators/sensors required for control systems and decentralized peripheral solutions are connected to inputs or outputs via terminals using input/output modules. In the case of series-produced machines or larger quantities of the same structures or structural variants, this results in a high level of work and testing. In such cases, it is advantageous not to tap the signals at the terminals of the control device, but to connect them via plug-in connectors and, for example, preassembled cables. However, this requires the control system to output or receive the signals directly on a customer-specific or application-specific printed circuit board. The printed circuit board in turn has interfaces or plug-in connectors for the application-specific automation.

Version 1.5.1 of the publication "Design guide for EJ backplane for TwinSafe modules" dated Jan. 29, 2018 has already proposed a solution for application-specific structures of modules and plug-in connectors on a printed circuit board.

One disadvantage with the conventional modularly assembled automation system is that the layout or routing from a backplane bus of the applied modules must be repeatedly recreated and checked for fail-safety by the manufacturer of the modules. A further drawback is that the conventional modularly assembled automation system requires the provision of modified modules that further extend a manufacturer's existing module range by a further module. The special routes for the backplane bus, i.e., the logic bus on the backplane for the modules, results in increased costs for the backplane. This is because the manufacturer's specifications for the logic bus with respect to impedance and radio-frequency behavior are applicable.

SUMMARY OF THE INVENTION

In view of the foregoing, it is an object of the present invention to provide a modularly assembled automation system comprising a main unit having a plug-in bus port connector, a plurality of modules each having a plug-in bus connector and a plug-in signal connector and a motherboard on which the main unit and the modules are arranged with a plurality of connection devices which provides a solution to the above-described disadvantages of a modularly assembled automation system.

This and other objects and advantages are achieved in accordance with the invention are achieved by a modularly assembled automation system comprising a main unit having a plug-in bus port connector, a plurality of modules each having a plug-in bus connector and a plug-in signal connector, a backplane bus board in a layered structure with bus conductor tracks to which a plurality of plug-in module connectors are connected, in which in turn the plug-in bus connectors of the modules are arranged, a motherboard on which a number of connector elements are arranged, where the plug-in signal connectors of the modules are arranged in the connector elements and the connector elements are in electrical contact with the conductor tracks of the motherboard.

The modularly assembled automation system furthermore comprises a plurality of connection devices, which are arranged on the motherboard and that are in electrical contact with the conductor tracks of the motherboard such that electrical connection paths are provided between the connector elements and hence to the plug-in module connectors of the modules and the connection devices, where the connection devices are structure for connection to process signal cables, where the modules are configured to communicate with the main unit via the plug-in bus connectors via the backplane bus board and configured to forward logic outputs of the main unit as signals to the plug-in signal connectors.

The modules are also configured to forward signals at the plug-in signal connectors which come from the connection device as logic inputs to the main unit via the plug-in bus connectors and the backplane bus board, where the bus conductor tracks and the layered structure of the backplane bus board are configured such that a layer stack comprising the bus conductor tracks and core material contains features necessary for maintaining the signal integrity of the signals on the backplane bus board and thus, with respect to the signal integrity of the signals on the backplane bus board, this is arranged separately on the motherboard.

The inventors have recognized that one disadvantage with a modularly assembled automation system on a motherboard is that a customer who must construct such a modularly assembled automation system on a motherboard must always consider how to achieve the routing or the unbundling and the layout of the conductor track for the backplane bus of the modules without paying attention to a certified specification for the signal integrity of the signals on a backplane bus. This means that the routing or unbundling of a logic bus on the motherboard increases the cost of the motherboard because specifications regarding impedance and RF behavior apply to the logic bus.

Advantageously, logic bus wiring, i.e., wiring of the bus conductor tracks on the backplane bus board, is now provided via a separate certified flat module that has been designed and already tested by a control system manufacturer and must only be placed on the respective motherboard.

For the purposes of the invention, 'signal integrity' should be understood to mean the quality of a digital signal to be transmitted from, for example, a driver (transmitter) of a module to the main unit and from the main unit to the driver (transmitter) of the module. Signal integrity can be negatively affected on a conductor track, such as on a multi-layer, by the effects of crosstalk and reflections (impedance behavior) or generally by the impedance of the conductor track and the surge impedance. In the case of backplane bus boards on which high-speed signals are transmitted, the parasitic effects of a copper line on the printed circuit board can no longer be ignored. Impedance of a conductor track depends, inter alia, on its geometry and varies, for example, in the case of curves or a change of position or in the case of throughplating. In addition, the signal lines or the conductor tracks must be correctly terminated with respect to their impedance at their ends or receivers. All these features, such as impedance, layered structure, thickness of the core material, possible terminating resistors, correspond to the features necessary for maintaining the signal integrity of the signals on the backplane bus board. Therefore, the manufacturer of such a system has tested and approved the backplane bus at one point with respect to signal integrity and thus ensures reliable data transmission.

Furthermore, it is advantageous for the backplane bus board to be arranged between the motherboard and a module base, where the module base is formed as a mounting base for the modules and is arranged on the motherboard, and where the module base has a first recess for one of the plug-in module connectors and a second recess for one of the connector elements.

This has the particular advantage that a range of modules already developed for, for example, a DIN rail structure can also be further used for a motherboard solution with a modular assembly. This very significantly reduces costs for development, support and production of the modules used. Furthermore, it is advantageous that the development effort for a motherboard solution is minimal, because (apart from a few assembly rules) a customer who wishes to implement the user-specific solution must only implement the desired functions in the motherboard and does not have to take into account the unbundling of a backplane bus necessary with respect to signal integrity.

Such a solution implemented by the backplane bus board means that all existing components are also immediately available for a motherboard assembly.

Furthermore, it is advantageous that, if a customer wishes to use further I/O modules with a motherboard solution, then it is not necessary for different module types to be kept available as spares.

Furthermore, it is advantageous if, starting from a first backplane bus board, which is connected via a first plug-in module connector to the plug-in bus port connector of the main unit, a second backplane bus board is connected to the first backplane bus board via a board connector.

The number of slots required for the modules used depends on the respective application-specific application or customer requirements. A control system manufacturer can now develop individual backplane bus boards of different lengths and, by segmenting them in this way, offer a customer a modular system for a respective task. Thus, it is not necessary for a separate backplane bus board to be developed and tested for every requirement.

It is of further advantage for the motherboard to have a protection block, which is connected in the connecting paths on the motherboard via a block base and is configured to protect a module with regard to overvoltage, polarity reversal or radio-frequency interference. With the existing modules in the range of modules, it was, or is, usual, for example, for a 24V DC load supply for one or more I/O modules in a control system to implement different electrical protection measures in a module to be plugged-in separately to ensure the appropriate approvals for the individual modules and their function. These protection measures include overvoltage protection, reverse polarity protection and a low-pass filter to attenuate radio-frequency interference. These protective measures were usually integrated in a separate supply module or housed in special base units. Herein, electrical tests/approvals require precisely defined conditions with respect to the components used and the corresponding printed circuit board layout. However, if a user prefers a motherboard solution for the application-specific automation assembly, then these protective functions would have to be integrated into the motherboard or, once again, it would be absolutely necessary to use a special supply module. However, this would increase the size of the actual assembly correspondingly. For this reason, a protection block was established that implements the electrical protection functions and that is easy for the user to plug onto the motherboard.

A further advantage is provided by configuring the motherboard as an application-specific printed circuit card with a conductor track layout for the distribution paths for the signals and the voltage supply on individual application-specific connection device formed as plug-in connectors in order to connect the main unit to machine modules associated with the specific application.

In summary, it can be said that a solution has now been found for using an existing control system with two rear-mounted plug-in connectors for an application-specific motherboard solution.

The concept mentioned here with the separately attached backplane bus board serves to ensure signal integrity for the bus communication of the modules to the main unit and back. A backplane bus board is now available with which the features for meeting signal integrity have been taken into account. These include an accurate impedance calculation for the conductor tracks to avoid signal reflections. Losses and scattering during propagation on long connections should be avoided. Crosstalk due to fast-switching digital signals on an adjacent conductor track must also be avoided by taking account of the geometry of the assembly. Overshooting and undershooting of digital signals is also avoided in an assembly with binding signal integrity. Additional losses along a connection due to copper roughness should also be avoided.

In other words, the object of these signal integrity practices with a suitable backplane bus board layout is to ensure that the quality of a signal does not degrade during transmission from a driver component to a receiver component.

The drawing shows an exemplary embodiment of a modularly assembled automation system with its components, in which:

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The drawing shows an exemplary embodiment of a modularly assembled automation system with its components, in which.

DETAILED DESCRIPTION OF THE EXEMPLARY EMBODIMENTS

Figure 1:
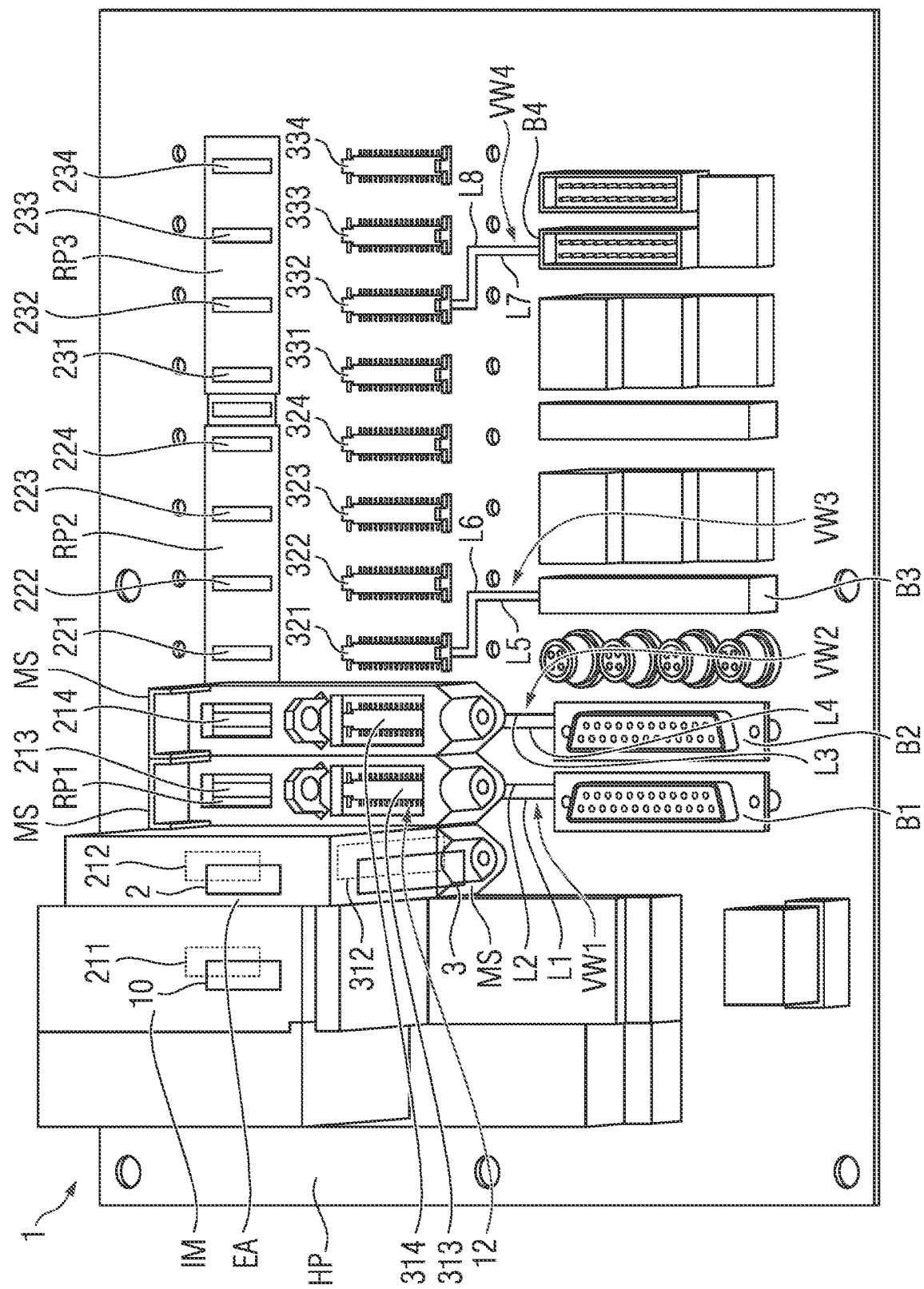
FIG. 1 shows a perspective view of the modularly assembled automation system 1 in accordance with the invention.

FIG. 1 depicts a modularly assembled automation system 1 including a main unit IM and a plurality of modules EA. Furthermore, a voltage supply is arranged on the left of the main unit IM. The main unit IM also has bus interfaces for communicating with higher-level automation systems. The modular automation system 1 can be assembled in a modular manner by concatenation a plurality of modules EA together. A first module EA would then be arranged directly to the right of the main unit IM. Further modules can be added on the right of this. The main unit IM and the modules are attached on a motherboard HP via module bases MS. Accordingly, a plurality of modules EA each with a plug-in bus connector 2 and a plug-in signal connector 3 (see also FIG. 4) can be arranged on the motherboard HP. To enable the modules EA to communicate with the main unit IK, a backplane bus board RP1,RP2,RP3 is connected in a layered structure with bus conductor tracks BL1, . . . , BL4 to a plurality of plug-in module connectors 211, . . . , 234. Accordingly, the plug-in bus connectors 2 of the modules EA are plugged into the plug-in module connectors 211, . . . , 234. By way of example, on the first module EA, the plug-in bus connectors 2 and the first plug-in module connector 212 are indicated schematically by lines and dashed lines.

Similarly, the plug-in signal connector 3 of the first module EA is plugged into a first connector element 312. Accordingly, the main unit IM is connected to a first plug-in module connector 211 via a plug-in bus port connector 10. In this manner, contact between the main unit IM and the first backplane bus board RP1 is established. Accordingly, a plurality of connector elements 312, . . . , 334 are arranged on the motherboard HP and the corresponding plug-in signal connectors 3 of the modules EA can be plugged into the connector elements 312, . . . , 334. The connector elements 312, . . . , 334 are in electrical contact with conductor tracks L1, . . . , L8 of the motherboard HP.

Furthermore, a plurality of connection devices B1,B2,B3, B4 is provided on the motherboard HP. The connection device B1,B2,B3,B4 are in application-specific electrical contact with the conductor tracks L1, . . . , L8 of the motherboard HP such that electrical connection paths VW1, . . . , VW4 are created between the connector elements 312, . . . , 334. Accordingly, there are electrical connections between the plug-in signal connectors 3 of the modules EA and the connection devices B1, . . . , B4. The connection devices B1, . . . , B4 are structured to connect to process signal cables. Consequently, the motherboard HP is formed as an application-specific printed circuit card with a conductor track layout for distribution paths for the signals and the voltage supply to individual application-specific connection devices B1, . . . , B4 formed as plug-in connectors to connect the main unit IM for the specific application to machine modules associated with the specific application.

The modules EA are configured to communicate with the main unit IM via the plug-in bus connectors 2 via the backplane bus board RP1,RP2,RP3 and configured to forward logic outputs of the main unit IM as signals to the plug-in signal connectors 3. The modules EA are further also configured to forward signals at the plug-in signal connectors 3 which emanate from the connection devices B1, . . . , B4 as logic inputs to the main unit IM via the plug-in bus connectors 2 and the backplane bus board RP1,RP2,RP3.

Figure 8:
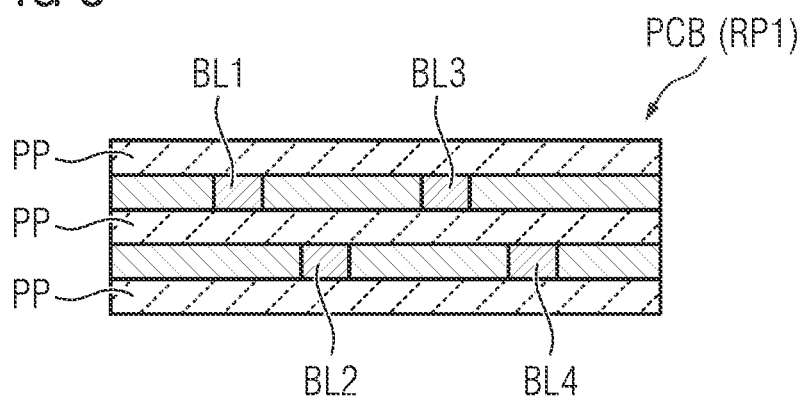
FIG. 8 shows a layer stack in accordance with the invention.

The backplane bus boards RP1,RP2,RP3 are configured with respect to their bus conductor tracks BL1, . . . , BL4 and their layered structure such that a layer stack PCB comprising the bus conductor tracks BL1, . . . , BL4 and core material PP contains features necessary for maintaining the signal integrity of the signals on the backplane bus board RP1,RP2,RP3 and thus, with respect to the signal integrity of the signals on the backplane bus board RP1,RP2,RP3, this is arranged separately on the motherboard HP (see FIG. 8).

Figure 5:
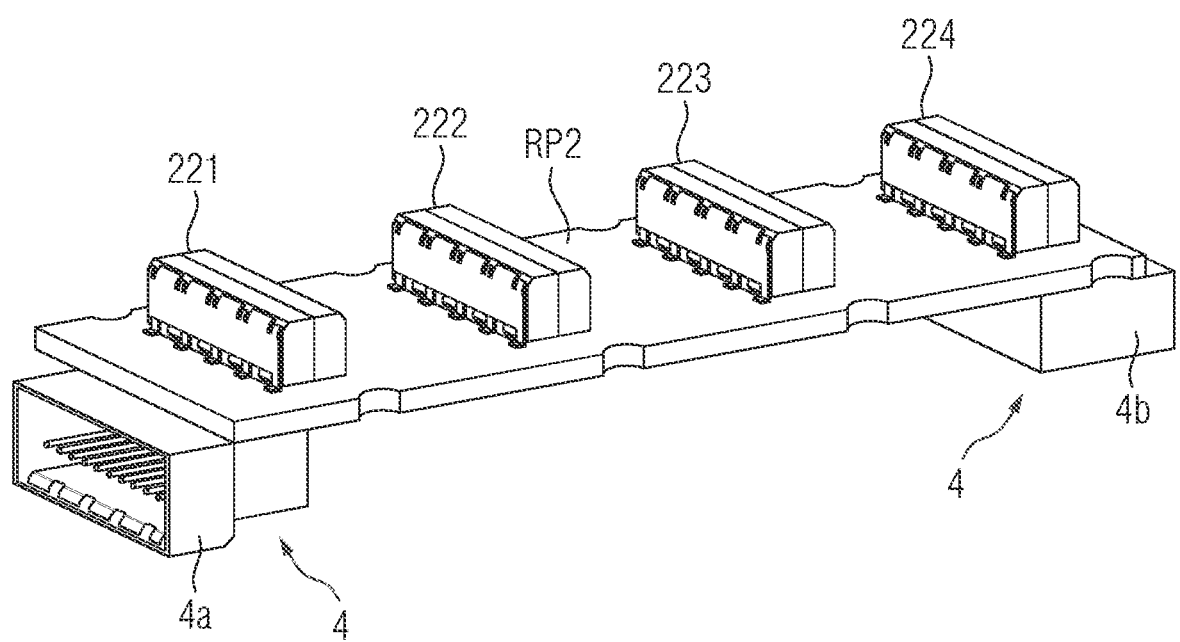
FIG. 5 shows a backplane bus board in accordance with the invention.
Figure 6:
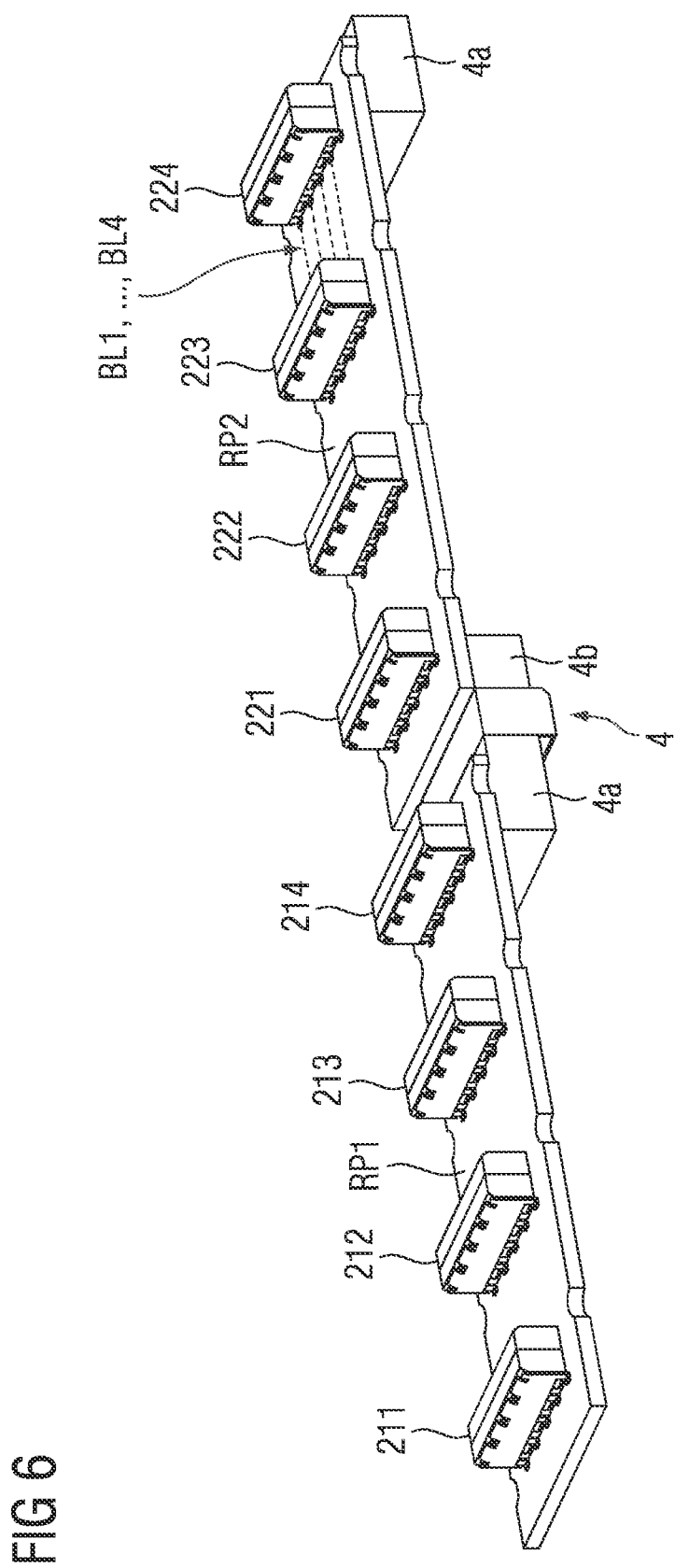
FIG. 6 shows two backplane bus boards plugged together in accordance with the invention.

In case there is the desired to accommodate a plurality of backplane bus boards RP1,RP2,RP3 on the motherboard HP, the motherboard HP has recesses in which board connectors 4 can be arranged (in this regard, see FIG. 5 and in particular FIG. 6). A module base MS is screwed onto the motherboard HP by screws, herein, the module base MS has a first recess 11 for one of the plug-in module connectors 211, . . . , 234 and a second recess 12 for one of the connector elements 312, . . . , 334. Accordingly, the backplane bus board RP1,RP2,RP3 is arranged between the motherboard HP and the module base MS. The module base MS serves as a mounting base for the modules EA. The modules EA can, for example, be snapped into the module base MS via latching lugs and, herein, form electrical connections with the corresponding plug-in connectors on the motherboard HP or on the backplane bus board RP1,RP2,RP3.

The plug-in board connectors 4 can be used to connect a first backplane bus board RP1, which is connected to the plug-in bus port connector 10 of the main unit via a first plug-in module connector 211, to a second backplane bus board RP2.

Figure 2:
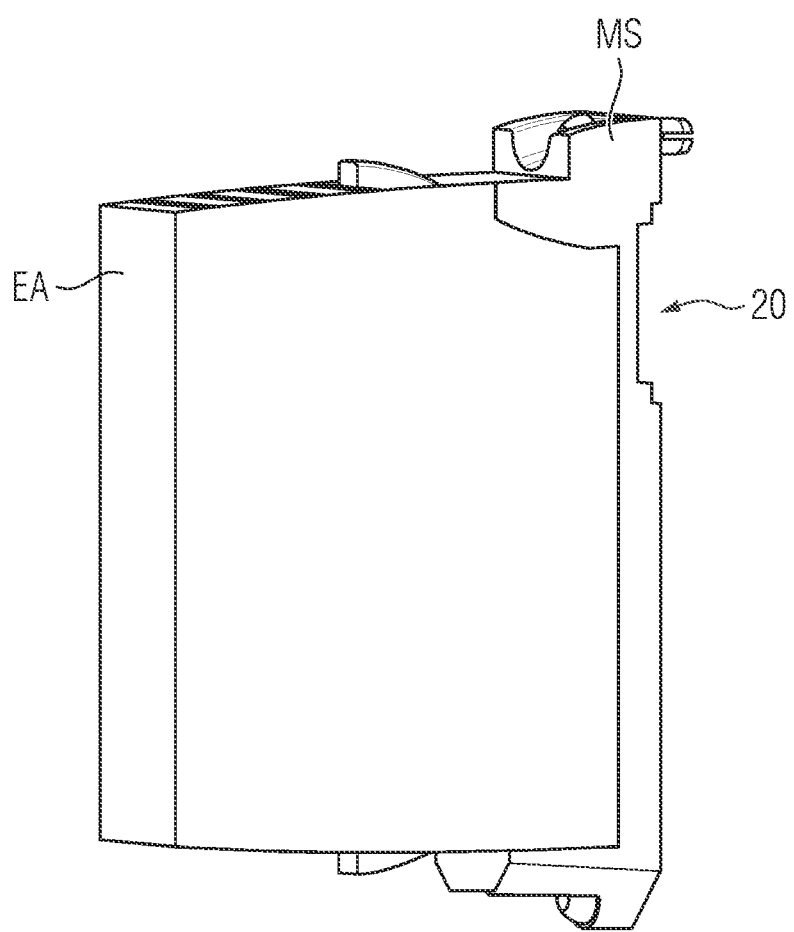
FIG. 2 shows perspective, front view of a module EA in accordance with the invention.

FIG. 2 shows a perspective, front view of the module EA, where the module EA is snapped into the module base MS. The rear of the module base MS has a recess 20 for the backplane bus board RP1 attached to the motherboard HP.

Figure 3:
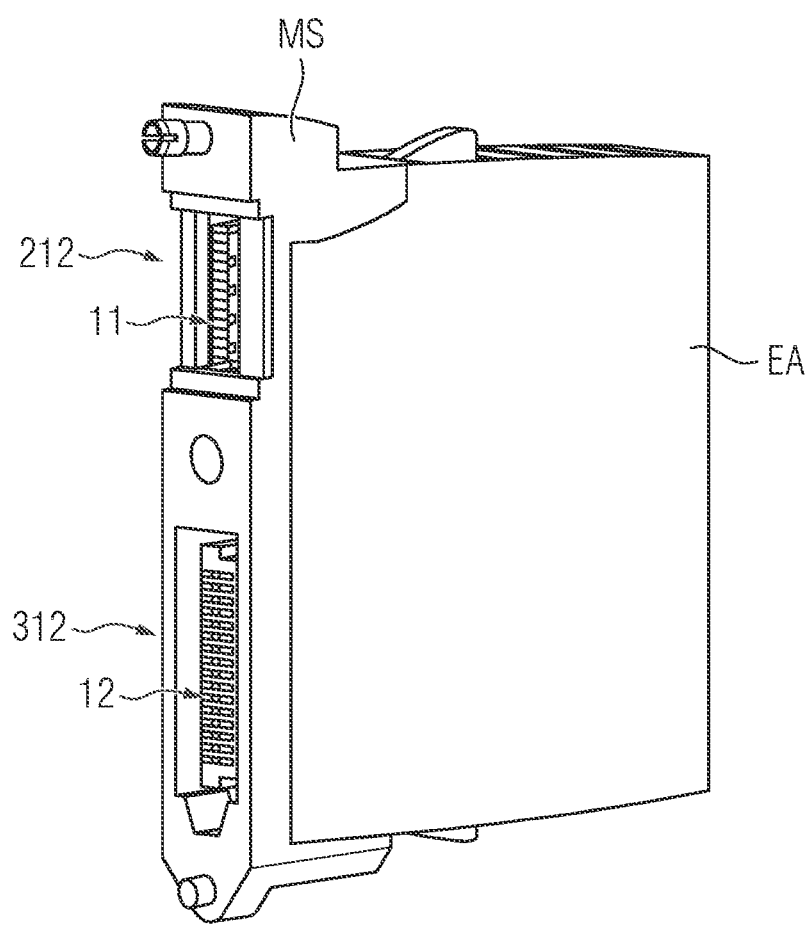
FIG. 3 shows a perspective, rear view of the module EA of FIG. 2.

FIG. 3 shows another perspective depiction of the module EA in FIG. 2, i.e., a perspective, rear view of the module EA. In the first recess 11, the second plug-in module connector 212 is depicted by way of example. In the second recess 12, the first connector element 312 is depicted by way of example.

Figure 4:
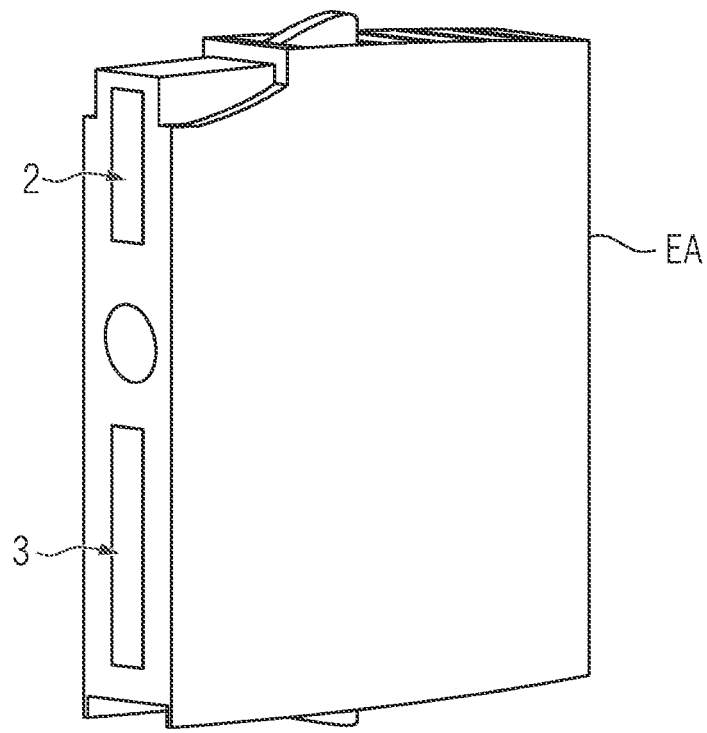
FIG. 4 shows a further perspective, rear view of the module EA of FIG. 2 without an attached module base.

FIG. 4 shows the module EA of FIG. 3 with a detached module base MS. On its rear, the module EA has a plug-in bus connector 2 and a plug-in signal connector 3 in each case.

FIG. 5 shows by way of example the second backplane bus board RP2 on which a first plug-in module connector 221 belonging to the second backplane bus board RP2, a second plug-in module connector 222, a third plug-in module connector 223 and a fourth plug-in module connector 224 are arranged. In order to enable a plurality of backplane bus boards RP1,RP2,RP3 to be connected in series, the second backplane bus board RP2 has a plug-in board connector 4, which is divided into a female plug-in connector 4a and a male plug-in connector 4b.

FIG. 6 shows the first backplane bus board RP1 and the second backplane bus board RP2, which are connected to a female connector 4a and a male connector 4b via the plug-in board connector 4. A first bus conductor track BL1, a second bus conductor track BL2, a third bus conductor track BL3 and a fourth bus conductor track BL4 are shown schematically in the second backplane bus board RP2.

Figure 7:
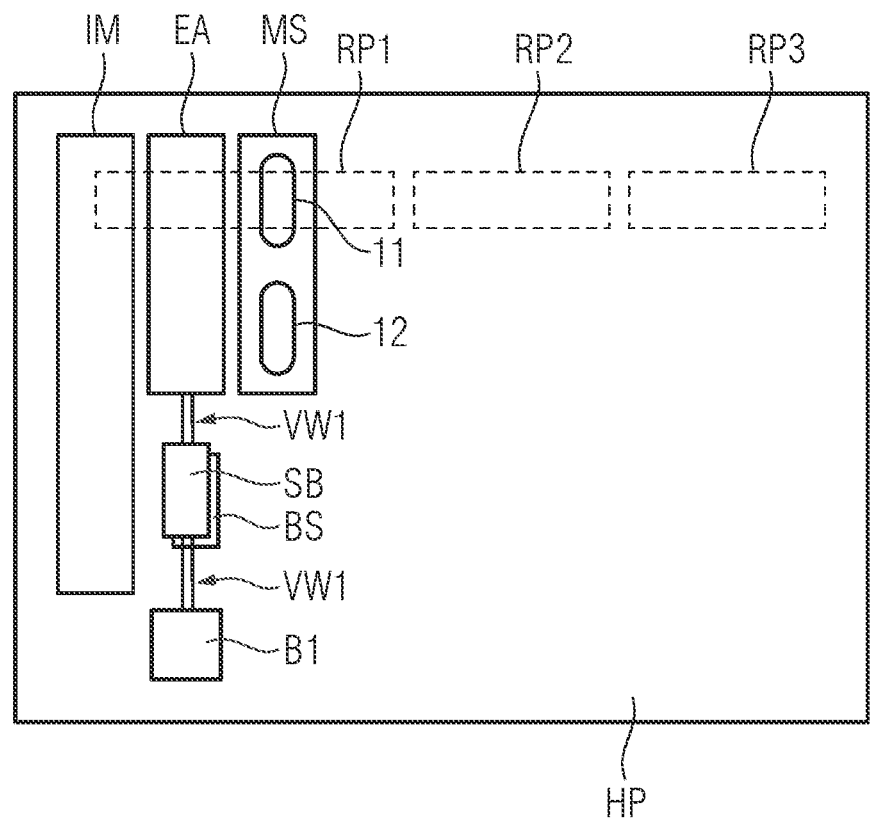
FIG. 7 shows a schematic depiction of the modular assembly of FIG. 1 with a plugged-in protection block.

FIG. 7 shows a schematic arrangement of a protection block SB on the motherboard HP. The protection blocks SB are connected to the connecting paths VW1, . . . , VW4 via a block base BS. The protection blocks SB are configured to protect a module EA with respect to overvoltage, polarity reversal and/or radio-frequency interference.

Thus, while there have been shown, described and pointed out fundamental novel features of the invention as applied to a preferred embodiment thereof, it will be understood that various omissions and substitutions and changes in the form and details of the the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A modularly assembled automation system comprising a main unit having a plug-in bus port connector;
a plurality of modules which each include a respective plug-in bus connector and a respective plug-in signal connector;
a backplane bus board in a layered structure with bus conductor tracks connected to a plurality of plug-in module connectors in which the respective plug-in bus connectors of the plurality of modules are arranged;
a motherboard on which a plurality of connector elements are arranged, respective plug-in signal connectors of the plurality of modules being arranged in the plurality of plug-in module connector elements which are in electrical contact with conductor tracks of the motherboard;
a plurality of connection devices which are arranged on the motherboard and which are in electrical contact with the conductor tracks of the motherboard such that electrical connection paths are created between the plurality of plug-in module connector elements and hence to the plug-in signal connectors of the modules and the plurality of connection devices where are configured to provide connection to process signal cables;
wherein the plurality of modules are configured to communicate with the main unit via the respective plug-in bus connectors via the backplane bus board and configured to forward logic outputs of the main unit as signals to the respective plug-in signal connectors;
wherein the plurality of modules are further configured to forward signals at the respective plug-in signal connectors which emanate from the plurality of connection devices as logic inputs to the main unit via the respective plug-in bus connectors and the backplane bus board; and
wherein the bus conductor tracks and the layered structure of the backplane bus board are configured such that a layer stack comprising the bus conductor tracks and core material contains features necessary for maintaining signal integrity of signals on the backplane bus board and thus, with respect to the signal integrity of the signals on the backplane bus board, this is arranged separately on the motherboard.

2. The modularly assembled automation system as claimed in claim 1, wherein the backplane bus board is arranged between the motherboard and a module base which is formed as a mounting base for the plurality of modules and arranged on the motherboard; and wherein the module base includes a first recess for one connector of the plurality of plug-in module connectors and includes a second recess for one connector element of the plurality of plug-in module connector elements.

3. The modularly assembled automation system as claimed in claim 2, wherein, starting from a first backplane bus board, which is connected via a first plug-in module connector to the plug-in bus port connector of the main unit, a second backplane bus board is connected to the first backplane bus board via a board connector.

4. The modularly assembled automation system as claimed in claim 2, wherein the motherboard includes a protection block which is connected in the connecting paths, via a block base, and which is configured to protect a module with respect to overvoltage, polarity reversal or radio-frequency interference.

5. The modularly assembled automation system as claimed in claim 1, wherein, starting from a first backplane bus board, which is connected via a first plug-in module connector to the plug-in bus port connector of the main unit, a second backplane bus board is connected to the first backplane bus board via a board connector.

6. The modularly assembled automation system as claimed in claim 5, wherein the motherboard includes a protection block which is connected in the connecting paths, via a block base, and which is configured to protect a module with respect to overvoltage, polarity reversal or radio-frequency interference.

7. The modularly assembled automation system as claimed in claim 1, wherein the motherboard includes a protection block which is connected in the connecting paths, via a block base, and which is configured to protect a module with respect to overvoltage, polarity reversal or radio-frequency interference.

8. The modularly assembled automation system as claimed in claim 1, wherein the motherboard is formed as an application-specific printed circuit card including a conductor track layout for distribution paths for the signals and the voltage supply to individual application-specific connector formed as plug-in connectors to connect the main unit to machine modules associated with a specific application.

* * * * *